United States Patent [19]

Tsai

[11] Patent Number: 5,053,719

[45] Date of Patent: Oct. 1, 1991

[54] WIDE-BAND PUSH-PULL AMPLIFIER

[75] Inventor: Ming-Chi Tsai, Marlboro, Mass.

[73] Assignee: Raytheon Company, Lexington, Mass.

[21] Appl. No.: 566,747

[22] Filed: Aug. 13, 1990

[51] Int. Cl.$^5$ ............................................... H03F 3/26
[52] U.S. Cl. ....................................... 330/269; 330/55; 330/275; 330/286; 333/26; 333/109; 333/156
[58] Field of Search ...................... 330/55, 122, 124 R, 330/269, 276, 295, 275, 301, 286; 333/25, 26, 109, 116, 156

[56] References Cited

U.S. PATENT DOCUMENTS

| | | | |
|---|---|---|---|
| 3,991,390 | 11/1976 | Conroy | 333/116 X |
| 4,531,098 | 7/1985 | Reed | 330/295 X |
| 4,994,755 | 2/1991 | Titus et al. | 330/54 |

Primary Examiner—James B. Mullins
Attorney, Agent, or Firm—Denis G. Maloney; Richard M. Sharkansky

[57] ABSTRACT

A radio frequency amplifier includes a first pair of quadrature couplers arranged to provide in response to an input signal first and second radio frequency signals having equal amplitudes and a first single-ended amplifier is fed by said first radio frequency signal to provide at an output thereof an amplified first signal having frequency components corresponding to a fundamental frequency of the input signal and second order products of the input signal. A second single-ended amplifier is fed by said second radio frequency signal for providing at an output thereof an amplified, second signal having second order products of the input signal and 180° phase shifter frequency of the input signal. The amplifier further includes a second pair of quadrature couplers arranged to provide, in response to said amplified first and second signals an output signal having a frequency corresponding substantially to the fundamental frequency of said output signal with said second order products of said first and second output signals being substantially cancelled.

6 Claims, 2 Drawing Sheets

WIDE-BAND PUSH-PULL AMPLIFIER

BACKGROUND OF THE INVENTION

This invention relates generally to radio frequency circuits and more particularly to radio frequency amplifier circuits.

As is known in the art, in order to provide radio frequency circuits which operate over relatively large and high operating frequency bandwidths, it is common practice to use as an active element in such amplifiers a so-called metal semiconductor field effect transistor (MESFET). Typically, such a MESFET is comprised of Group III-V materials, such as gallium arsenide. One problem associated with the use of a gallium arsenide MESFET, in particular in low noise, wide-band amplifier applications, is that the gallium arsenide MESFET has relatively high levels of nonlinearity. The high levels of non-linearity inherent in the MESFET produce undesired distortion in a amplified signal provided from the amplifier.

The transfer function of a GaAs FET operating as an amplifier can be expressed as:

$$E_0 = K_1 E_1 + K_2 E_i^2 + K_3 E_i^3 \ldots K_i E_i^3 \quad \text{Equation (1)}$$

where $E_i$ and $E_0$ are the input and output signal amplitudes, K is the linear gain coefficient and $K_i$'s for $i > 1$ are the ith-order nonlinear coefficients. For a two-tone input signal, $E_i = A(\cos \omega_1 t + \cos \omega_2 t)$, the output amplitude of the signal becomes $$E_0 = DC + \text{1st-order terms} + \text{2nd-order terms} + \text{3rd-order terms} + \ldots \quad \text{Equation (2)}$$

where

2nd-order
terms $= K_2 A^2 (\cos(\omega_i + \omega_2)t + \cos(\omega_1 - \omega_2)t) + \frac{1}{2} K_2 A^2 (\cos(2\omega_1 t) + \cos(2\omega_2 t))$    Equation (3)

From equation 3 it may be seen that both the second harmonics ($2\omega_i$) terms and the second-order intermodulation products ($\omega_i \pm \omega_2$) terms are related to the second-order nonlinear coefficient, $K_2$. Generally, the second-order intermodulation products are 6 dB higher than the second harmonics.

It may often occur that for a wide-band system second order products, that is frequency components comprised of sum and/or difference frequencies of frequency components in the input signal, may exist within the operating band of the amplifier, are thus amplified in the system. This is undesirable because they may cause ambiguities in the wideband system, as well as contribute to a reduction in power added efficiency of the amplifier.

SUMMARY OF THE INVENTION

In accordance with the present invention, a radio frequency amplifier includes a first pair of quadrature couplers arranged to provide in response to an input signal first and second radio frequency signals having equal amplitudes a 180° differential phase shift, and first single-ended amplifier means fed by said first radio frequency signal for providing at an output thereof an amplified first signal having frequency components corresponding to a fundamental frequency of the input signal and second order products of the input signal, and second single-ended amplifier means by said second radio frequency signal for providing at an output thereof an amplified, second signal having second order products of the input signal and 180° phase shifted frequency components corresponding to the fundamental frequency of the input signal. The amplifier further includes a second pair of quadrature couplers arranged to provide, in response to said amplified first and second signals, an output signal having a frequency corresponding substantially to the fundamental frequency of said output signal with said second order products of said first and second output signals being substantially cancelled. With such an arrangement, the second order products produced by the single-ended amplifiers are substantially cancelled thus providing an amplifier having improved linear operation over the operating frequency range of the single ended amplifiers.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
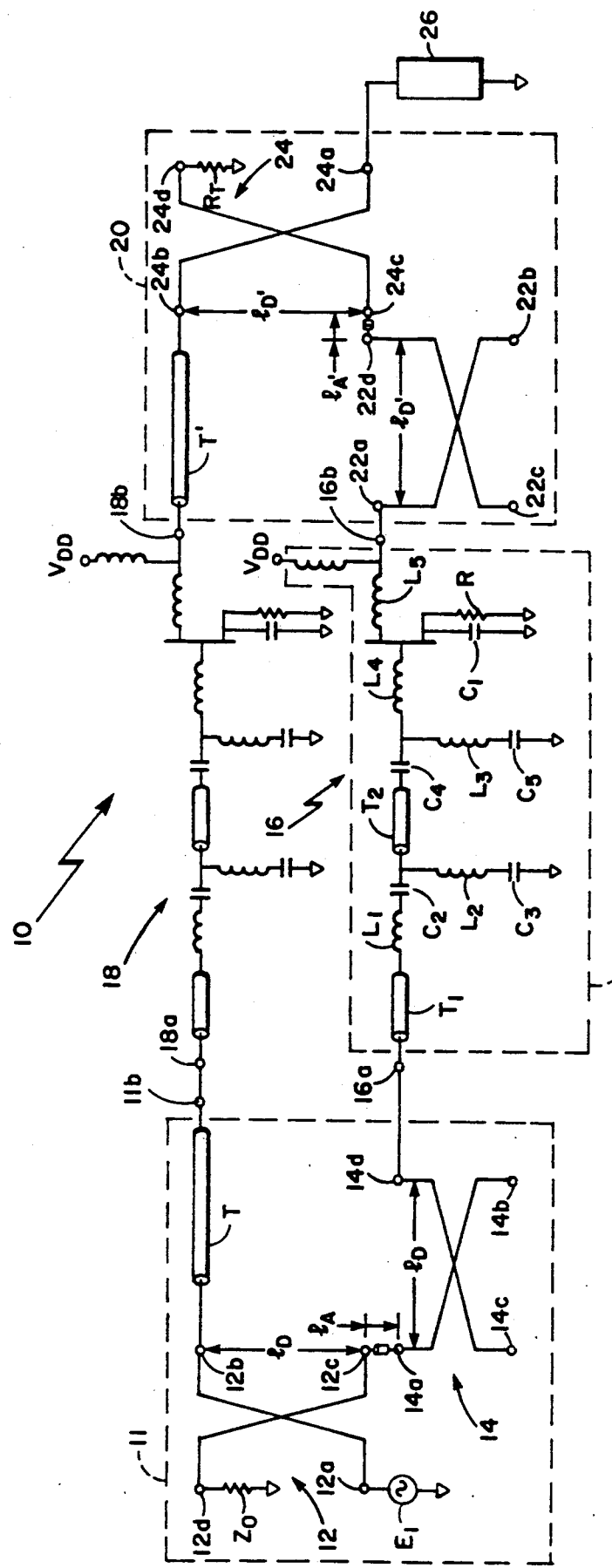
FIG. 1 is a schematic diagram of a wide-band push-pull amplifier having low second order products in accordance with present invention.
Figure 2:
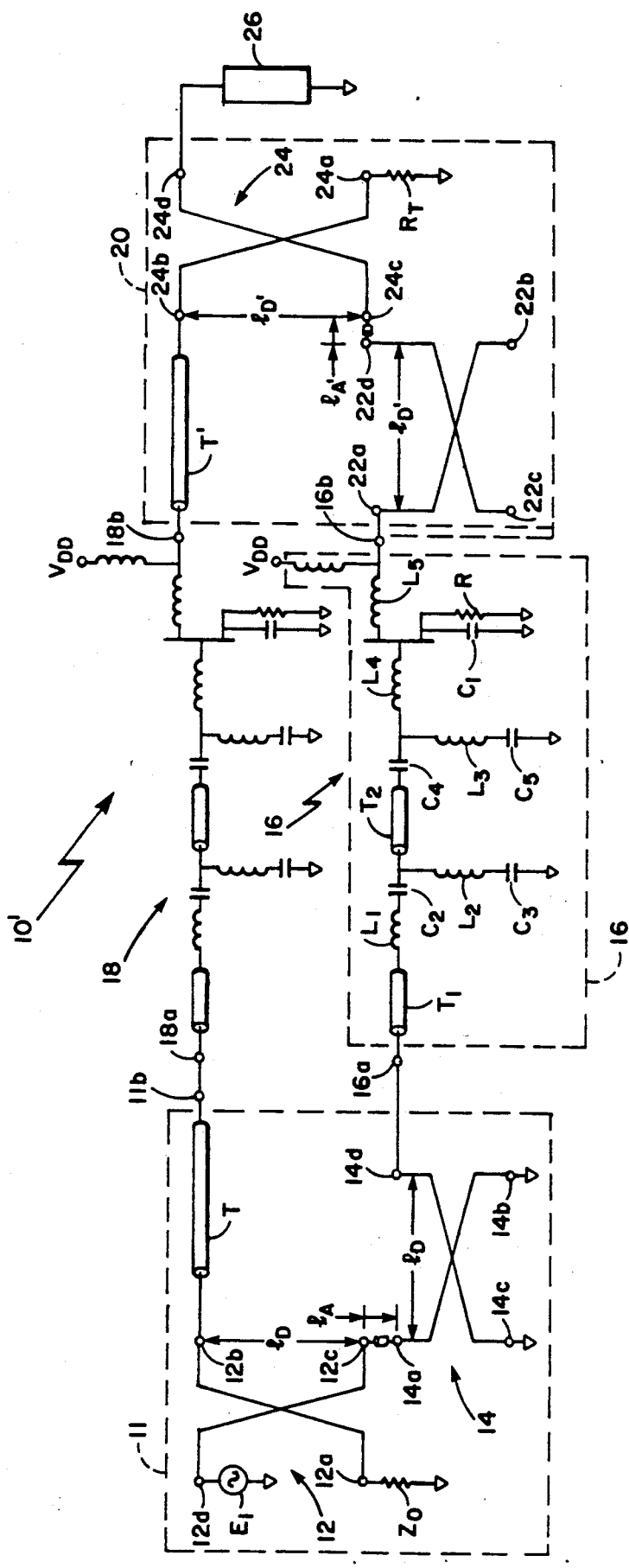
FIG. 2 is a schematic diagram of alternative arrangement of the input and output couplers in accordance with a further aspect of the present invention.

Referring now to the FIG. 1, a wide-band push-pull amplifier 10 having low level of intermodulation products is shown to include an input balun or coupler 11 which is fed an input signal at terminal 12a thereof and provides at output ports 11b and 14d a pair of signals having 180° differential phase shift. Here such network 11 is comprised of a pair of Lange type quadrature couplers 12, 14 and transmission line T having an impedance of 50 ohms. Here each coupler 12, 14 provides a differential phase shift of 90° and has an input port 12a, 14a, a direct port 12b, 14b, a coupled port 12c, 14c, and an isolated port 12d, 14d. The pair of couplers are connected as shown. That is, the isolated port 12d of coupler 12 is terminated in a characteristic impedance of $Z_0$ to reduce reflections from coupler 12 whereas isolated port 14d is coupled to one end of a single-ended amplifier 16 as will be described. Terminal 12b of coupler 12 is connected via transmission line T to a second single-ended amplifier 18 as will also be described whereas terminal 12c is connected to input port 14a of coupler 14. Direct and coupled ports 14c, 14b of coupler 14 are terminated in either open circuits as shown for amplifier 10 FIG. 1 or short circuits (FIG. 2) to cause energy fed to said ports to be reflected back towards isolated port 14d. Coupler 12 provides a pair of output signals having equal amplitudes at ports 12b, 12c which have a differential phase shift of 90°. An additional 90° of phase shift is provided between the signals fed from port 12b and port 14d by the second coupler 14. The amplitude of the signals at ports 12b and 14d are here also substantially equal because the Lange coupler 14 has direct and coupled ports 14b, 14c terminated in short circuits or open circuits which cause substantially all of said energy to be reflected back towards port 14d. Due to the relative ease in providing an open circuit at microwave frequencies an open circuit termination for ports 14b, 14c is here preferred. However, as shown in FIG. 2, short circuits at terminals 14b, 14c may also be used. If short circuits are used, here the input signal is fed to the isolated port 12d of coupler 12 and the input port 12a of coupler 12 is terminated in impedance $Z_0$, as shown in FIG. 2. Thus, a signal fed from source $E_1$ has a first portion coupled to terminal 12b and a second equal amplitude portion coupled to terminal 14d. Such signals are fed respectively to amplifiers 16 and 18. Here amplifiers 16 and 18 are substantially identical matched single-ended amplifiers. Description of amplifier 16 will thus suffice for a corresponding similar detailed description of amplifier 18.

Amplifier 16 includes a section of transmission line $T_1$ which is coupled to an impedance matching network, here a band-pass filter network having three series paths and two shunt paths to ground, as shown. Here said band-pass filter 16' provides an impedance match between the coupler 14 and the gate electrode of a transistor FET 1 over at least the passband of the single-ended amplifier. The band-pass filter 16' includes inductor $L_1$, capacitor $C_2$ connected in a series as the first series path, a pair of shunt paths comprised of inductor $L_2$ and capacitor $C_3$ and inductor $L_3$ and capacitor $C_5$ and a second series path comprised of transmission line $T_2$ and capacitor $C_4$ interconnected by the shunt paths, as shown. An inductor $L_4$ comprising part of the last series path is coupled between the gate electrode G of a transistor FET 1 and the connection of the second shunt path, as also shown. The transistor FET 1 is here a field effect transistor, in particular, a metal semiconductor field effect transistor (MESFET) which is comprised of gallium arsenide or other suitable Group III-V material. In addition to the gate electrode, the transistor FET 1 also includes a source electrode (S) coupled to a reference potential via an R.F. path to ground here with capacitor $C_1$, and an indirect D.C. path to ground via resistor R. Resistor R is used to provide a bias to the gate electrode of transistor FET 1 and thus said amplifier has a self-biased gate electrode. The transistor FET 1 further includes a drain electrode (D) coupled via an inductor $L_5$ to a large value inductor or R.F. choke $L_c$, as shown. One end of inductor $L_c$ is coupled to a supply voltage $V_{DD}$ as also shown. The other end of inductor $L_c$ is coupled to a transmission line $T_3$ and to the output 16b thereof. Output 16b, as well as, output 18b of amplifier 18 are coupled to an output balun or coupler 20, here being substantially identical to balun 11, except that balun 20 combines two input signals 180° out of phase and provides a composite output signal to a load 26. Output coupler 20 includes a first quadrature, here "Lange" coupler 22 having input and isolated ports 22a, 22d coupled between output 16b and a second Lange coupler 24, as shown, with coupled and direct ports 22b, 22c terminated in non-absorbing terminations such as open, as shown, or short circuits (FIG. 2). When using short circuit terminations, the direct port 12b is still coupled to amplifier 18 whereas the coupled port 12c is coupled to coupler 14, as shown in FIG. 2.

The output coupler 20 further includes the second Lange coupler 24 having coupled and direct ports 24b, 24c coupled to port 22d and one end of a transmission line T', the other end of transmission line T' being coupled to the output 18b of the amplifier 18. An isolated port 24d of coupler 24 is terminated in an impedance $Z_o$, whereas the output port 24a is coupled to the load 26. As also shown in FIG. 2, when short circuits are used for direct and coupled ports 22b, 22c, the isolated port 24d of coupler 24 provides the output port to load 26 and the output port 24a of coupler 24 is terminated in $Z_o$ for the reasons mentioned above.

Port 12b of coupler 12 is connected via the transmission line T having a length $l_T$ related to $l_A + 2l_D$ where $l_A$ is the length between the output port 12c and the input port 14a of couplers 12, 14 and $l_D$ is the electrical pathlength difference between port 12b and port 12c of coupler 12. To insure that signals fed to terminal 16a and 18a of amplifier 16 and 18 have equal amplitudes and are out of phase by 180° the length ($l_T$) of transmission line section T would be given by $l_T$ equals $l_A + 2l_D$. Correspondingly, the length $l_T'$ of transmission line T' is also given by $l_t' = l_A' + 2l_D'$ where $l_A'$ is the length between ports 22d, 24b and $l_D'$ is the length between ports 24b, 24c.

A signal $E_1 = A \cos(\omega T + K(X))$ is fed at port 12a where X equals the electrical pathlength, K(X) is the phase of the signal $A \cos(\omega T + K(X))$ and K is a propagation constant. At port 12a the signal has an initial phase K(X) equal to zero since X=0. As the signal passes through coupler 12, it passes through an electrical pathlength of D and thus at the direct port 12b, the phase is K(X) where $X = l_D$. At the coupled port, the phase is K(X) where $X = l_D - 90°/K$, the signal at 12c is coupled to port 14a through an electrical pathlength of $l_A$ and thus at port 14a of coupler 14 said signal has the electrical pathlength of $l_x = l_D + l_A - 90°/K$. The signal at terminal 12b is coupled to terminal 18a of amplifier 18 through transmission line T having a length $l_T$ and thus at terminal 18a said signal has an electrical path length of $X = l_D + l_T$. Whereas, at terminal 16a, the input of amplifier 16, the phase is K(X) where $= 3l_D + l_A - 180°/K$. Such electrical pathlength is equal to $3l_D$ since the signal fed at terminal 14a is reflected from each one of the direct and coupled terminals 14c and 14d and thus through the coupler 14 transverses the distance $l_D$ twice, thus providing the signal at terminal 16a having an electrical pathlength of $3l_D + l_A - 180°/K$. Accordingly, if the length $l_D$ of transmission line is $l_T + (l_A + 2l_D)$ then the electrical pathlength difference between the signal at 18a and the signal at terminal 16a will be substantially 180°.

As mentioned before, the transfer function of a GaAs FET operating as an amplifier can be expressed as:

$$E_0 = K_1 K E_i + K_2 E_i^2 + K_3 E_i^3 \ldots K_i E_i^3 \qquad \text{Equation (1)}$$

where $E_i$ and $E_0$ are the input and output signal amplitudes, $K_1$ is the linear gain coefficient and $K_1$'s for $i > 1$ are the ith-order nonlinear coefficients. For a two-tone input signal, $E_i = A(\cos \omega_1 t + \cos \omega_2 t)$, the output amplitude of the signal becomes $$E_0 = DC + \text{1st-order terms} + \text{2nd-order terms} + \text{3rd-order terms} + \ldots \qquad \text{Equation (2)}$$

where $$\text{2nd -order terms} = K_2 A^2 (\cos(\omega_1 + \omega_2)t + \cos(\omega_1 - \omega_2)t) + \tfrac{1}{2} K_2 A^2 (\cos(2\omega_1 t) + \cos(2\omega_2 t)) \qquad \text{Equation (3)}$$

From equation 3 it may be seen that both the second harmonics ($2\omega_i$) terms and the second-order IMD products ($\omega_1 \pm \omega_2$) terms are related to the second-order nonlinear coefficient, $K_2$. Generally, the second-order IMD products are 6 dB higher than the second harmonic To show that the second order terms can be cancelled by a Lange coupler balun amplifier, as described in FIG. 1 let the input signal be $$E_1 = A \cos(\omega t) \quad \text{Equation (4)}$$

at port 12a of the coupler in FIG. 1. At port 12b and 14d, the signals become respectively:

$$E_2 = (A/\sqrt{2}) \cos(\omega t + K(l_d + l_T)) \quad \text{Equation (5)}$$

$$E_3 = (A/\sqrt{2}) \cos(\omega t + K(l_a + 3l_d) - 180°) \quad \text{Equation (6)}$$

where K is the propagation constant, $l_a$ is the physical length between the two Lange couplers, and $l_d$ is the physical length of the Lange coupler.

To achieve the required 180° phase difference between ports 11b, 14d, the length ($l_T$) of transmission line T should be $$l_T = a + 2l_d \quad \text{Equation (7)}$$

The fundamental modes from ports 11b and 14d to port 24a experience another 180° phase difference and combine at port 24a via the output balun 20. However, since the FET is the source of non-linearity, the second-harmonics and second order intermodulation products, as well as other even order harmonics and intermodulation products are combined out-of-phase and thus cancel at the output 24a.

Each of the single-ended GaAs FET amplifiers here are designed to operate in the frequency range from 2.5 to 6.5 GHz using a GaAs MESFET 300 μ gate periphery, such as Raytheon P/N RPK 2003, Raytheon SMDO, Northboro, Ma. The FET matching network is a lumped-element shunt-L series-C band-pass filter network. The matching elements, inductors $L_3$, $L_2$, here 140 and 275 mils of 1 mil diameter wires, and capacitors $C_4$ and $C_2$ here 1 pf and 8.2 pf) were selected to provide broadband matching of the gate to the couplers 12, 14 to achieve wideband amplification.

The Lange coupler 12 is laid out on a 15 mil thick alumina substrate (not shown). The width and gap of the coupler fingers are 1.2 mil and 1 mil respectively to achieve optimum amplitude balance, return loss and isolation. The length $l_d$ of the coupler 12 is 280 mils. A second identical coupler 14 balun is cascaded, as shown in FIG. 1. To achieve the condition $l_T = l_a + 2l_d$, the 50-ohm line length, $l_T$, is 760 mils. A similar arrangement is provided for output balun 20 with coupler 22, 24 each being quadrature Lange type couplers.

Having described preferred embodiments of the invention, it will now become apparent to one of skill in the art that other embodiments incorporating their concepts may be used. It is felt, therefore, that these embodiments should not be limited to disclosed embodiments, but rather should be limited only the spirit and scope of the appended claims.

What is claimed is:

1. A radio frequency amplifier, comprising:
    a first pair of quadrature couplers arranged to provide, in response to an input signal, first and second radio frequency signals having equal amplitudes with said second signal having a 180° differential phase relative to the phase of the first signal;
    first amplifier means fed by said first signal for providing at an output thereof an amplified first signal having frequency components corresponding to a fundamental frequency of the input signal and second order products of the input signal;
    second amplifier means fed by said second signal for providing at an output thereof an amplified second signal having frequency components corresponding to second order products and to the fundamental frequency of the input signal with said fundamental frequency components having a phase difference of 180° relative to the fundamental components of the first signal; and
    a second pair of quadrature couplers arranged to combine said first and second amplified signals with a relative phase difference of 180° to provide a combined output signal having a frequency corresponding to said fundamental frequency and with said second order products of said first and second signals substantially canceling.

2. The radio frequency amplifier of claim 1 wherein said first pair of couplers are first and second four port quadrature couplers and comprise:
    said first four port quadrature coupler having an input port, a pair of output ports a first one being a direct port and a second being a coupled port which provide a first and a second signal having a 90° differential phase, and an isolated port with a first one of said input port and isolated port being fed by an input signal and the second one of said input and isolated ports being terminated in a characteristic impedance; and
    said second four port quadrature coupler having an input port fed by the second signal and an isolated port providing an output signal and its direct and coupled ports terminated in a non-absorbing termination.

3. The amplifier of claim 2 wherein said nonabsorbing terminations are short circuits and said input signal is fed to the isolated port.

4. The amplifier of claim 2 wherein said nonabsorbing terminations are open circuits and said input signal is fed to the input port.

5. The amplifier of claim 2 wherein said amplifier means each comprise a single-ended amplifier comprising:
    a lumped element input impedance matching network having a first end coupled to an output of a respective one of said first and second four port quadrature couplers;
    a field effect transistor having a gate electrode coupled to a second end of said lumped element network, a source electrode coupled to a reference potential, and a drain electrode coupled to a respective one of first and second input ports of said second pair of quadrature couplers.

6. The radio frequency circuit of claim 2 wherein said four port couplers are each quadrature Lange couplers.

* * * * *

UNITED STATES PATENT OFFICE
CERTIFICATE OF CORRECTION

Patent No. 5,053,719　　　　　　　　　　Dated October 1, 1991

Inventor(s) Ming-Chi Tsai

It is certified that error appears in the above-identified patent and that said Letters Patent is hereby corrected as shown below:

Col. 1, Line 28: Delete "K is the linear", and replace with: --$K_1$ is the linear--;

Col. 4, Line 48: Delete "$E_0=K_1KE_i$" and replace with: --$E_0=K_1E_i$--;

Col. 4, Line 53: Delete "$E_i-A$", and replace with: --$E_i=A$--; and

Col. 5, Line 22: Delete "$l_T=_a+2l_d$", and replace with: --$l_T=l_a+2l_d$--.

Signed and Sealed this

Eighth Day of June, 1993

Attest:

MICHAEL K. KIRK

Attesting Officer　　　　Acting Commissioner of Patents and Trademarks